(12) United States Patent
Maruyama et al.

(10) Patent No.: US 12,107,199 B2
(45) Date of Patent: Oct. 1, 2024

(54) LIGHT-EMITTING ELEMENT LAMP AND METHOD FOR MANUFACTURING THE SAME

(71) Applicant: DOWA Electronics Materials Co., Ltd., Tokyo (JP)

(72) Inventors: Tsukasa Maruyama, Akita (JP); Takashi Araki, Inzai (JP)

(73) Assignee: DOWA Electronics Materials Co., Ltd., Chiyoda-ku (JP)

( * ) Notice: Subject to any disclaimer, the term of this patent is extended or adjusted under 35 U.S.C. 154(b) by 393 days.

(21) Appl. No.: 17/597,396

(22) PCT Filed: Jul. 10, 2020

(86) PCT No.: PCT/JP2020/027146
§ 371 (c)(1),
(2) Date: Jan. 5, 2022

(87) PCT Pub. No.: WO2021/010350
PCT Pub. Date: Jan. 21, 2021

(65) Prior Publication Data
US 2022/0262992 A1 Aug. 18, 2022

(30) Foreign Application Priority Data
Jul. 12, 2019 (JP) ................. 2019-130382

(51) Int. Cl.
*H01L 33/58* (2010.01)
*F21V 19/00* (2006.01)
*G02B 7/02* (2021.01)
*G02B 27/09* (2006.01)

(52) U.S. Cl.
CPC ............. *H01L 33/58* (2013.01); *G02B 7/021* (2013.01); *G02B 7/027* (2013.01); *G02B 27/0916* (2013.01); *F21V 19/001* (2013.01)

(58) Field of Classification Search
CPC ............. H01L 33/58; H01L 33/48–486; H01L 33/52–60; G02B 7/021; G02B 7/027; G02B 27/0916; F21V 19/001
See application file for complete search history.

(56) References Cited

U.S. PATENT DOCUMENTS

2014/0203311 A1* 7/2014 Schowalter ........... H01L 33/405
438/27
2014/0367709 A1* 12/2014 Bierhuizen ............. H01L 33/58
257/88
(Continued)

FOREIGN PATENT DOCUMENTS

JP 2002141556 A 5/2002
JP 2009539250 A 11/2009
(Continued)

OTHER PUBLICATIONS

Sep. 29, 2020, International Search Report issued in the International Patent Application No. PCT/JP2020/027146.
(Continued)

*Primary Examiner* — Jesse Y Miyoshi
*Assistant Examiner* — Andrew Chung
(74) *Attorney, Agent, or Firm* — KENJA IP LAW PC

(57) ABSTRACT

Provided is a light-emitting element lamp capable of increasing a light extraction efficiency and its manufacturing method. The light-emitting element lamp according to the present invention includes: a light-emitting element having a semiconductor layer provided on a substrate; a first lens of spherical segment shape provided by protruding from a surface on the opposite side of the semiconductor layer of the substrate and having a spherical cap that includes a bottom surface consisting of an attaching surface to the surface and a protruding surface from the surface and a radius of curvature $R_1$; and a second lens attached to the side of the light-emitting element and the protruding surface of (Continued)

the first lens, in which the second lens has a concave curve from a peripheral side of the bottom surface of the first lens to the semiconductor layer side on the side of the light-emitting element.

15 Claims, 10 Drawing Sheets

(56) References Cited

U.S. PATENT DOCUMENTS

| | | | |
|---|---|---|---|
| 2017/0005245 A1* | 1/2017 | Hsu | H01L 33/507 |
| 2019/0019783 A1* | 1/2019 | Tangring | H01L 33/505 |
| 2020/0098953 A1* | 3/2020 | Ota | H01L 33/54 |

FOREIGN PATENT DOCUMENTS

| | | |
|---|---|---|
| JP | 2014165082 A | 9/2014 |
| JP | 2017139309 A | 8/2017 |
| JP | 2017521872 A | 8/2017 |
| WO | 2015020229 A1 | 2/2015 |

OTHER PUBLICATIONS

Jan. 18, 2022, International Preliminary Report on Patentability issued in the International Patent Application No. PCT/JP2020/027146.

* cited by examiner

Step S11

Step S12

LIGHT-EMITTING ELEMENT LAMP AND METHOD FOR MANUFACTURING THE SAME

TECHNICAL FIELD

The present invention relates to a light-emitting element lamp and a method for manufacturing the same.

BACKGROUND

The group III nitride semiconductor is a wide band gap semiconductor having a direct transition type band structure, and can obtain light with a wide range wavelength from visible light to ultraviolet light. For example, ultraviolet light-emitting elements formed by using this are expected to have a wide range of applications such as sterilization, water purification, medical treatment, lighting, and high-density optical recording.

Light-emitting elements can be obtained by forming a buffer layer on a substrate for epitaxial growth made of sapphire, etc., and then sequentially forming an n-type semiconductor layer, a light emitting layer, and a p-type semiconductor layer made of group III nitride semiconductor. Then, the light emitted from the light-emitting element is extracted mainly from the surface on the opposite side of the growth surface of the substrate and sides. Hereinafter, the growth surface for epitaxial growth of the substrate is referred to as the substrate surface, and the substrate surface on the opposite side of the growth surface is referred to as the substrate back surface.

The difference in the refractive index between a substrate such as sapphire and air is larger than the difference in the refractive index between the substrate surface and the group III nitride semiconductor. For example, the refractive index of sapphire is about 1.8, and the refractive index of air is 1.0, so the critical angle is about 33°. Therefore, the total reflection is likely to occur at the substrate interface (the substrate back surface and the substrate sides) of the light-emitting element. When total reflection of light occurs at the interface of the substrate, only a part of the light generated at the light emitting layer can be extracted out of the light-emitting element. Therefore, in order to improve the light extraction efficiency of the light-emitting element, a lamp provided with a lens on the light-emitting element (hereinafter referred to as a "light-emitting element lamp") has been studied. In general, the percentage of the light extracted to the outside of the device out of the light emitted from the light emitting layer is referred generally to as "light extraction efficiency." In the present specification, the percentage of the light extracted from the light-emitting element lamp including a lens out of the light emitted from the light emitting layer is referred to as "light extraction efficiency."

For example, Patent Literature 1 (PTL 1) discloses an illumination device provided with a hard lens on a UV ray emitting die. According to PTL 1, the total reflection of UV emitted light can be reduced by the hard lens, and the light extraction efficiency as the entire lighting device can be increased.

CITATION LIST

Patent Literature

PTL 1: JP2017-521872(A)

SUMMARY

Technical Problem

In recent years, there has been a demand for technology of further increasing the light emission output of light-emitting element lamps, and it is essential to improve the light extraction efficiency to increase the light emission output. It is therefore an object of the present invention to provide a light-emitting element lamp capable of increasing the light extraction efficiency and a manufacturing method thereof.

Solution to Problem

We diligently studied ways to address the above issues. Based on the area of the back surface of the sapphire substrate (also referred to as the upper surface of the chip, which refers to the surface on the opposite side of to the growth surface of the semiconductor layer) and the area of sides of the sapphire substrate (sides of the chip), the relationship between the percentage of the light extracted from the substrate back surface of the light-emitting element and the percentage of the light extracted from the sides of the substrate can be obtained. FIG. 1 shows a graph illustrating each percentage of the light extracted from the substrate back surface and the light extracted from the substrate sides when the shape of the back surface of the sapphire substrate is 1 mm×1 mm and the area of the side is 4×1 mm×[substrate thickness].

As illustrated in FIG. 1, since over half of the light is extracted from the top surface of the chip, various studies are underway to improve the light extraction from the top surface of the chip. In contrast, when the thickness of the sapphire substrate is 430 μm, the percentage of the light extracted from the sides of the chip accounts for 36.0% of the total, depending on the thickness of the substrate. Therefore, in order to improve the light emission output of the entire light-emitting element lamp, it is necessary to effectively use the light that reaches not only the substrate back surface but also the substrate sides, and it is important to improve the light extraction efficiency of the light that reaches the substrate sides.

In the technology of PTL 1 described above, the light extracted from the substrate sides of the semiconductor light-emitting element (side emission light) is not considered. In order to further improve the light extraction efficiency of the light-emitting element lamp, we came up with an idea of providing a concave lens (second lens) in each space created between the first lens protruding, like an umbrella, from the substrate back surface and the substrate side, and found that, by the second lens, the light extraction efficiency of the light-emitting element lamp can be increased. The configuration completed based on the above findings is summarized below.

(1) A light-emitting element lamp, comprising:
   a light-emitting element having a semiconductor layer provided on a substrate;
   a first lens of spherical segment shape provided by protruding from a substrate back surface on the opposite side of the semiconductor layer of the substrate and having a spherical cap including a bottom surface consisting of an attaching surface to the substrate back surface and a protruding surface from the substrate back surface and a radius of curvature $R_1$; and a second lens attached to side of the light-emitting element and the protruding surface of the first lens, wherein, the second lens has a concave curve from a periphery side of the bottom of the first lens to a side of the semiconductor layer on a side of the light-emitting element.

(2) The light-emitting element lamp according to (1) above, wherein a height H of the spherical cap is smaller than or equal to the radius of curvature $R_1$.

(3) The light-emitting element lamp according to (1) or (2) above, wherein the height H of the spherical cap is equal to the radius of curvature $R_1$.

(4) The light-emitting element lamp according to any one of (1) to (3) above, wherein the radius of curvature $R_1$ of the first lens is greater than or equal to $(1/\sqrt{2})$ times a length L of a long side of the attaching surface.

(5) The light-emitting element lamp according to any one of (1) to (4) above, wherein the radius of curvature $R_1$ of the first lens is smaller than or equal to $\sqrt{2}$ times the length L of the long side of the attaching surface.

(6) The light-emitting element lamp according to (1) above, wherein a minimum radius of curvature $R_2$ of the concave curve of the second lens is smaller than or equal to 1.2 mm in a cross-section that passes through an apex of the first lens, is parallel to the long side of the attaching surface and is perpendicular to the attaching surface.

(7) The light-emitting element lamp according to any one of (1) to (6) above, wherein the first lens includes quarts or sapphire.

(8) The light-emitting element lamp according to any one of (1) to (7) above, wherein the second lens includes resin cured product.

(9) The light-emitting element lamp according to any one of (1) to (8) above, wherein a light emission wavelength of the light-emitting element is from 200 to 400 nm.

(10) A method of manufacturing the light-emitting element lamp according to any one of (1) to (9) above, the method including:

a first step of placing the substrate back surface of the substrate of the light-emitting element on the bottom surface of the first lens; and a second step of forming the second lens attached to the side of the light-emitting element and the protruding surface of the first lens.

(11) The method of manufacturing the light-emitting element lamp according to (10) above, wherein the second step includes:

(i) an application step of applying a precursor of the resin cured product to the side of the light-emitting element and the protruding surface of the first lens; and (ii) a curing step of curing the precursor to form the second lens.

(12) The method of manufacturing the light-emitting element lamp according to (11) above, wherein a light emission wavelength of the light-emitting element is from 200 to 400 nm.

(13) A method of manufacturing a light-emitting element lamp, including:

a first step of placing a bottom surface of a first lens of spherical segment shape having a spherical cap with a radius of curvature $R_1$ on a substrate back surface on the opposite side of the semiconductor layer of the substrate of a light-emitting element having a semiconductor layer provided on the substrate; and a second step of forming a second lens to be attached to two surfaces, a protruding surface from the substrate back surface of a bottom surface of the first lens excluding an attaching surface to the substrate back surface and a side of the light-emitting element, wherein the second step includes a step in which the second lens forms a concave curve from a peripheral side of the bottom surface of the first lens to the semiconductor layer side of the side of the light-emitting element.

Advantageous Effect

According to the present invention, a light-emitting element lamp capable of increasing the light extraction efficiency and a manufacturing method thereof can be provided.

DETAILED DESCRIPTION

Embodiments of the present invention will be described below with reference to the drawings. In principle, the same reference signs are given to the same components to omit duplicate explanations.

(Light-Emitting Element Lamp)

Figure 1:
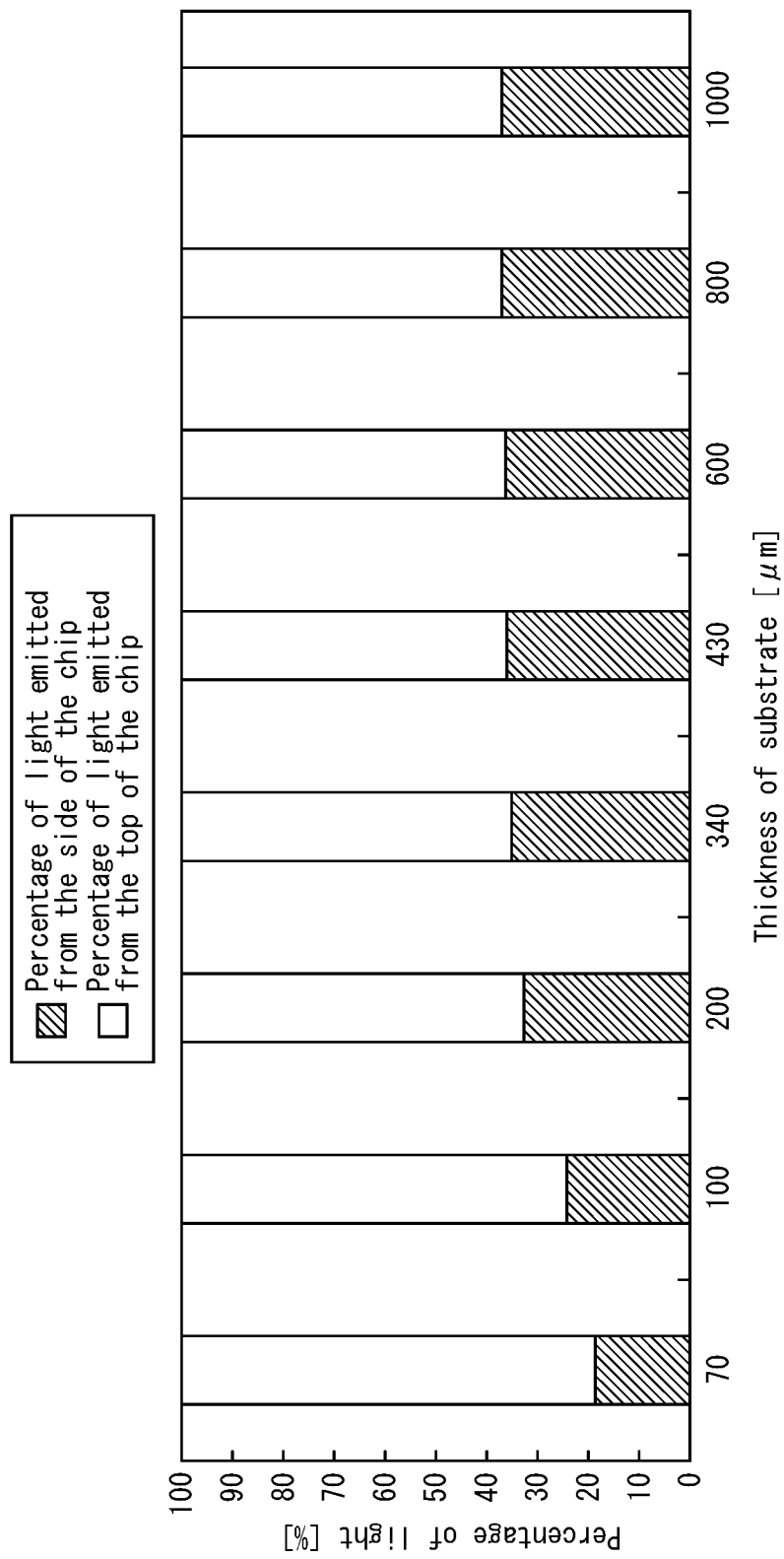
FIG. 1 is a graph illustrating respective percentages of the light extracted from the back surface and the light extracted from the sides of the substrate, according to our study.
Figure 2:
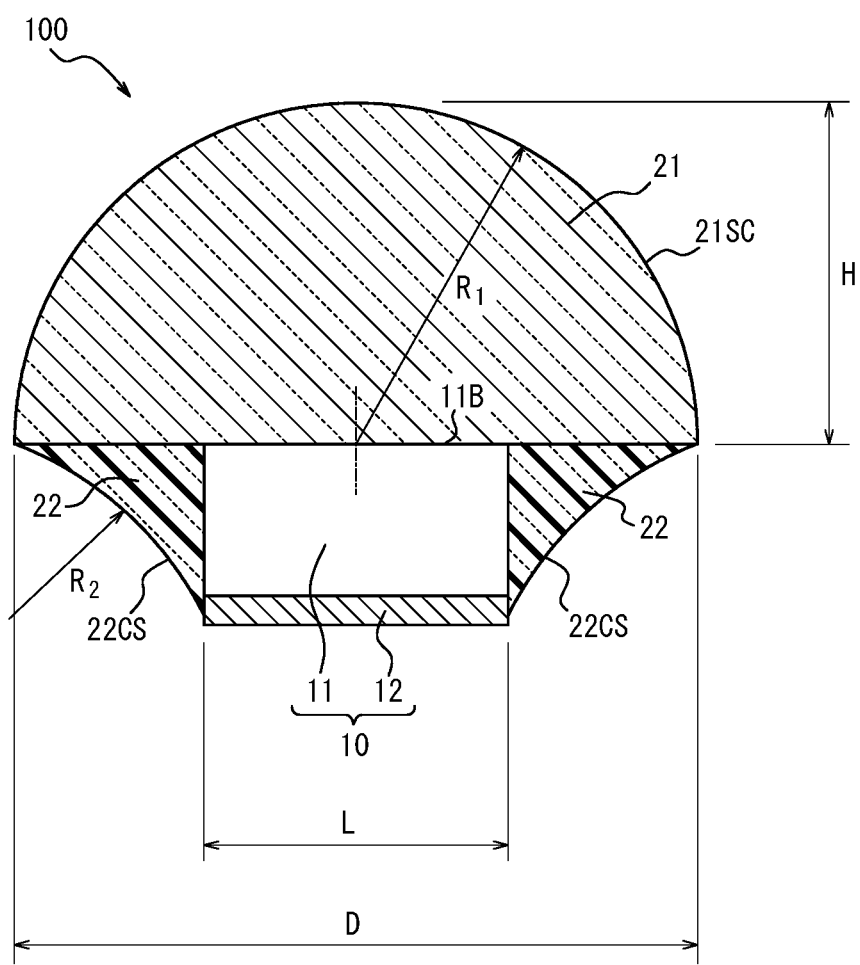
FIG. 2 is a schematic cross-sectional view in a vertical cross-section that passes through an apex of a first lens of a light-emitting element lamp according to an embodiment of the present invention and is parallel to the long side of the substrate back surface of the light-emitting element.

FIG. 2, which is a schematic diagram of a vertical cross-section that passes through the apex of a first lens 21 and is in parallel to the long side of the light-emitting element, is referred. With respect to the reference signs of the first lens 21, FIG. 6A described later will also be referred. A light-emitting element lamp 100 includes at least a light-emitting element 10, a first lens 21 and a second lens 22. The light-emitting element 10 has a semiconductor layer 12 provided on a substrate 11. The first lens 21 has a spherical segment shape, and has a bottom surface 21BS, which is a cutting plane of a sphere, and a spherical cap 21SC, which is a sphere cut by the cutting plane. The spherical cap 21SC has a radius of curvature $R_1$ (which corresponds to the radius of the sphere cut by the cutting plane of the spherical segment).

The first lens 21 protrudes from the light-emitting element 10. The "protrudes" here means that, in the vertical cross-section illustrated in FIG. 2, the first lens 21 has, above the horizontal plane (light extracting direction) of the substrate back surface 11B, a portion that laterally protrudes from the substrate back surface 11B, and that, when looking down at the first lens 21 from above, the outline of the first lens 21 is larger than that of the substrate back surface 11B, and includes the substrate back surface 11B.

The bottom surface 21BS of the first lens 21 includes an attaching surface 21BC to the substrate back surface 11B on the opposite side of the semiconductor layer 12 of the substrate 11 and a protruding surface 21BP from the substrate back surface 11B. Then, the bottom surface 21BS of the first lens 21 is attached to the substrate back surface 11B at the attaching surface 21BC, and is not attached to the substrate back surface 11B at the protruding surface 21BP, but protrudes from the substrate 11.

Further, the second lens 22 is attached to the corner created by the side of the light-emitting element 10 and the protruding surface 21 BP of the first lens 21. Further, the second lens 22 has a concave curve 22CS from the peripheral side of the bottom surface 21BS of the first lens 21 to the semiconductor layer 12 side of the light-emitting element 10. In FIG. 2, etc., for simplicity of the drawing, the concave curve 22CS is illustrated with a constant radius of curvature, but the radius of curvature of the concave curve 22CS does not have to be constant over the entire surface, and the radius of curvature may be different in some places. The circle with the smallest radius is defined as the minimum radius of curvature when various circles with different radius are fitted along the concave curve 22CS without creating a gap therebetween. In the vertical cross-section described above, the second lens 22 should have a concave curve as seen from the two wall surfaces, that is, the side of the light-emitting element 10 and the protruding surface 21BP of the first lens 21.

The technical significance of the second lens 22 in the light-emitting element lamp 100 according to the present invention will be described with reference to FIG. 3. For the sake of clarity, some of the reference signs illustrated in FIG. 2 are omitted in FIG. 3, so the reference signs in FIG. 2 are also referred. For example, the case where the second lens 22 is formed by the silicon resin with a refractive index of 1.52 is examined. In this case, the critical angle $\theta_m$ at the interface between the silicon resin and the air is about 41°. The concave curve 22CS from the periphery of the bottom surface 21BS of the first lens 21 to the bottom of the light-emitting element 10 is provided by the second lens 22. The range of covering the side of the light-emitting element 10 by the second lens 22 is preferably the range of ⅔ or more of the thickness from the bottom surface 21BS of the first lens 21 to the substrate 11, and more preferably the range from the bottom surface 21BS of the first lens 21 to beyond the boundary between the substrate 11 and the semiconductor layer 12.

Figure 3:
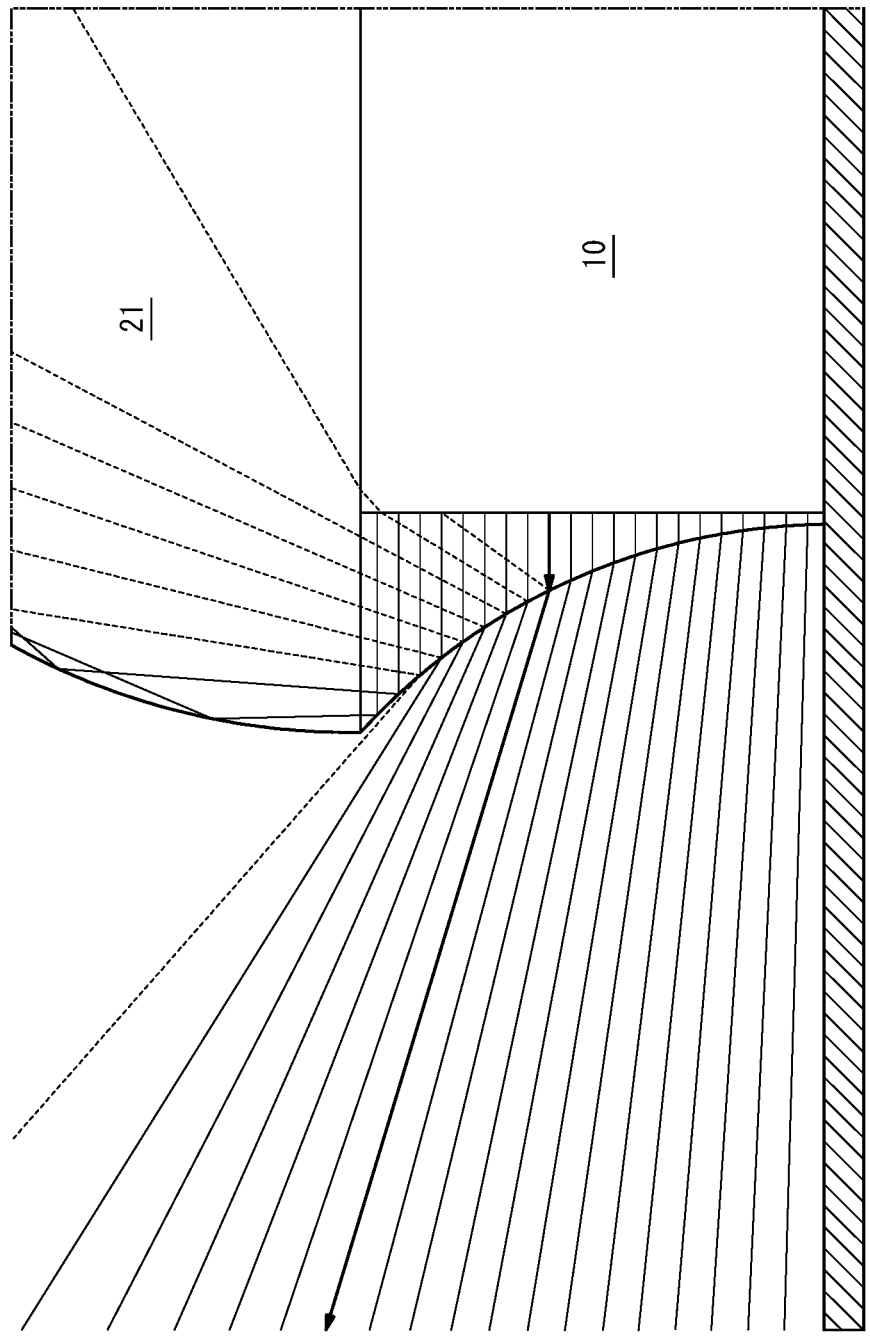
FIG. 3 is a diagram illustrating transmission and reflection of the radiation light at the interface of a second lens in the light-emitting element lamp according to the present invention.

With such a second lens 22, as illustrated in FIG. 3, most of the laterally emitted light traveling from the side of the light-emitting element 10 into the second lens 22 can reach the interface between the concave curve 22CS and the air at an incident angle smaller than the critical angle $\theta_m$. As a result, most of the light extracted from the side of the light-emitting element 10 can be extracted out of the second lens 22.

Figure 4:
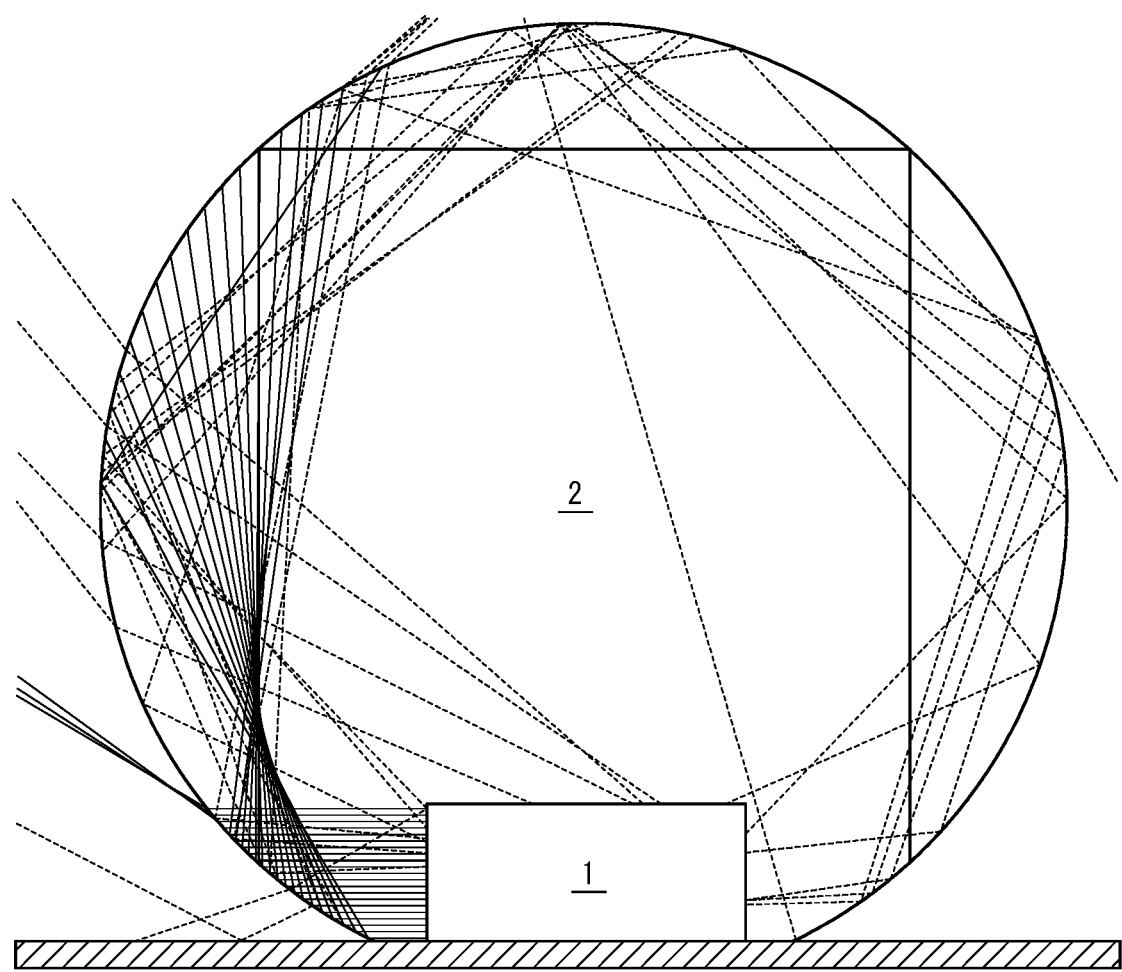
FIG. 4 is a diagram illustrating transmission and reflection of the radiation light in a comparative aspect in which the second lens is a convex curve.

In order to further clarify the technical significance of the present invention, the lens 2 of convex curve shape according to the comparison aspect illustrated in FIG. 4 will be continuously referred. The lens 2 of convex curve shape can be formed by the potting method and seals the light-emitting element 1. The second lens 22 has the concave curve 22CS, and the lens 2 has a convex curve, thus they are different from each other. As illustrated in FIG. 4, most of the side emission light traveling from the side of the light-emitting element 1 to the lens 2 is reflected inside the lens 2. Further, the reflected light of the side emission light is bent to the inside of the lens 2 also above the lens 2, and as a result, most of the light caused by the side emission light is not extracted out of the lens 2. Therefore, the lens 2 of convex curve shape illustrated in FIG. 4 does not contribute to improvement of light emission output of a light-emitting element lamp.

In this manner, the light-emitting element lamp 100 according to the present invention includes the second lens 22 provided with the concave curve 22CS, in addition to the first lens 21 protruding from the light-emitting element 10, and thus can increase the light extraction efficiency of the side emission light. As a result, the light extraction efficiency of the entire light-emitting element lamp can also be increased. The details of each configuration will be described in sequence below.

<Light-Emitting Element>

Figure 5:
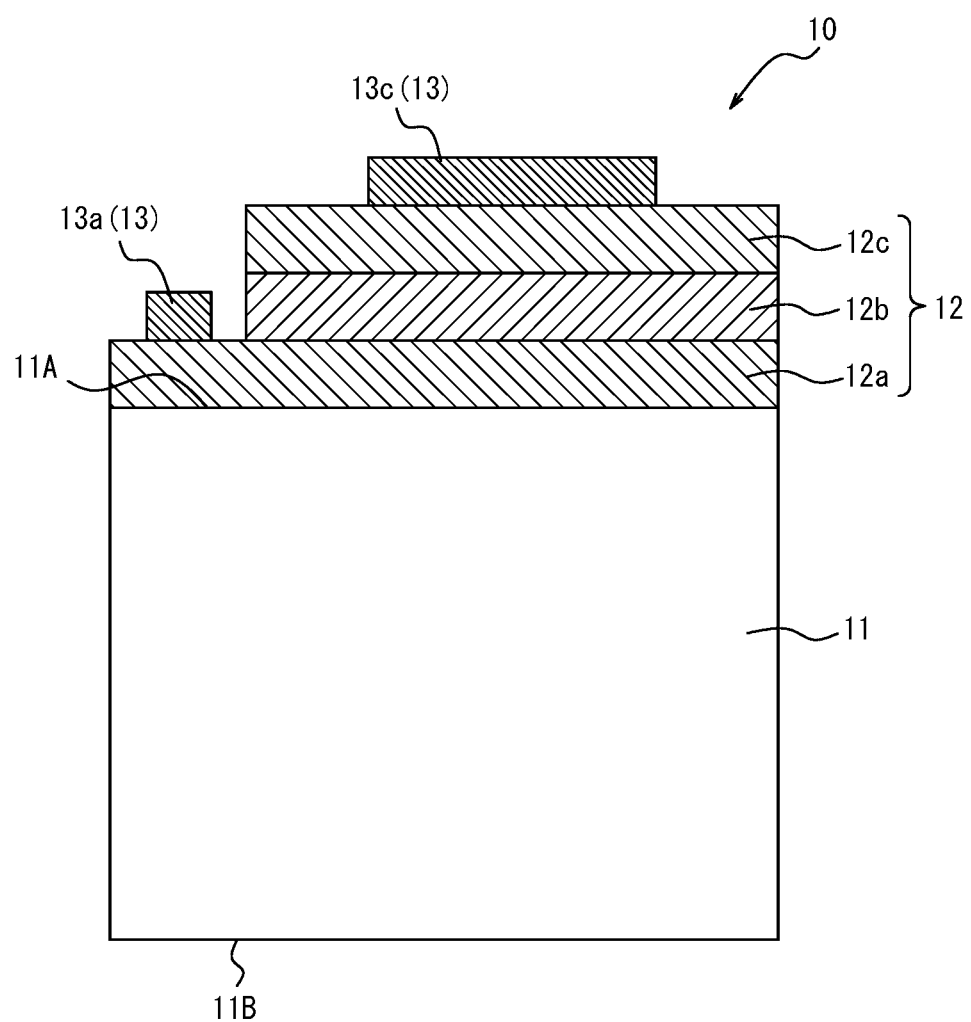
FIG. 5 is a schematic cross-sectional view illustrating an aspect of a light-emitting element applicable to the light-emitting element lamp according to the present invention.

Refer to FIG. 5. The light-emitting element 10 has the substrate 11 and the semiconductor layer 12 provided on the substrate surface 11A (growth surface) of the substrate 11. The light-emitting element 10 may further have the electrode 13 on the semiconductor layer 12.

<<Substrate>>

As the substrate 11, a substrate that is generally transparent to the light emitted from the semiconductor layer 12 and is used as the light extraction side, such as a sapphire substrate, for example, can be used. An AlN template substrate in which an AlN layer is epitaxially grown on the surface of a sapphire substrate may be used. Further, an MN single crystal substrate or an AlGaN single crystal substrate may also be used as the substrate 11.

—Size—

The thickness of the substrate 11 is not particularly limited, but can be selected appropriately from 70 μm to 1000 μm. In order to increase the percentage of the light extracted from sides, the thickness of the substrate 11 is preferably 200 μm or more, and is also preferably 430 μm or less. The thickness of the substrate 11 may be 800 μm or less, or 650 μm or less. Since the total thickness of the semiconductor layer 12 and the electrode 13 is 100 μm at most, the thickness of the light-emitting element 10 is dominated by the thickness of the substrate 11.

Further, when looking down at the substrate back surface 11B of the light-emitting element 10, the length L of the long side is preferably about from 0.3 mm to 3.0 mm, and is more preferably from 0.4 mm to 2.0 mm. That is, the length L of the long side of the attaching surface 21BC of the first lens 21 is preferably about from 0.3 mm to 3.0 mm, and is more preferably from 0.4 mm to 2.0 mm. In the Example described below, the shapes of the substrate surface 11A and the substrate back surface 11B of the substrate 11 are square, and thus the lengths of the long side and the short side are the same, but the substrate surface 11A and the substrate back surface 11B on the opposite side thereof may have any shapes such as a rectangle, for example. There may be an inclination or an unevenness between the substrate back surface and the substrate surface in the thickness direction caused during cutting of the substrate 11, as long as it does not affect the effect of formation of the second lens 22 according to the present invention.

<Semiconductor Layer>

The semiconductor layer 12 can be formed by the group III nitride semiconductor (AlInGaN). The semiconductor layer 12 can have a light-emitting layer 12b that emits green, blue or ultraviolet light, and the light-emitting layer 12b may be sandwiched between an n-type semiconductor layer 12a and a p-type semiconductor layer 12c. The central wavelength of the light emitted from the light emitting layer 12b can be adjusted by the semiconductor composition and the dopant, and is preferably from 200 nm to 400 nm, and more preferably from 260 nm to 360 nm for the ultraviolet light.

Although FIG. 5 illustrates an aspect in which the n-type semiconductor layer 12a, the light emitting layer 12b, and the p-type semiconductor layer 12c are sequentially formed on the substrate 11, the conductive type may be vice versa. Each of the n-type semiconductor layer 12a, the light emitting layer 12b, and the p-type semiconductor layer 12c may have a single-layer structure or a multi-layer structure. The light emitting layer 12b may have a quantum well structure. The semiconductor layer 12 may also have an undoped semiconductor layer in addition to each of these layers.

—Other Configurations—

The light-emitting element 10 may have an electrode 13. The electrode 13 may have an n-type electrode 13a provided on the n-type semiconductor layer 12a and a p-type electrode 13c provided on the p-type semiconductor layer 12c. For example, the p-type semiconductor layer 12c and the light-emitting layer 12b may be partially etched to expose a part of the n-type semiconductor layer 12a, and the n-type electrode 13a can be provided on the exposed n-type semiconductor layer 12a. The arrangement of the electrodes 13 illustrated in FIG. 5 is only one example, and any electrode pattern may be used.

The light emitting element 10 may further have a general configuration applicable to the light emitting element, such as a protective film made of silicon oxide or silicon nitride.

<First Lens>

Figure 6A:
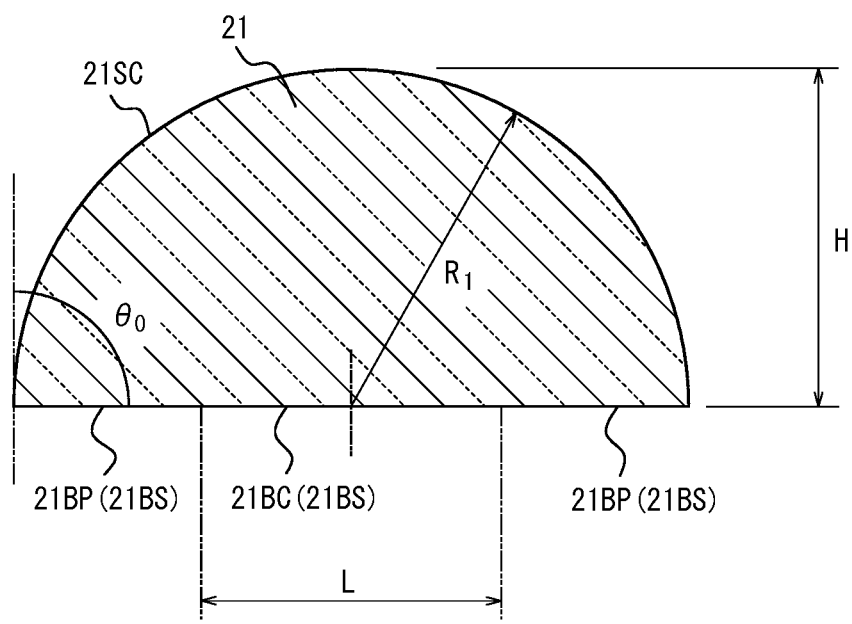
FIG. 6A is an aspect of the first lens applicable to the light-emitting element lamp according to the present invention.
Figure 6B:
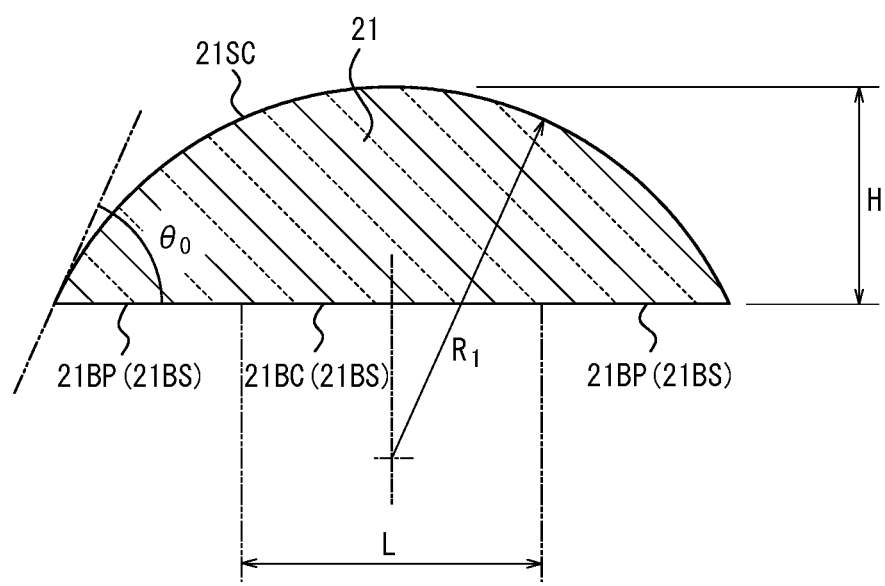
FIG. 6B is another aspect of the first lens applicable to the light-emitting element lamp according to the present invention.
Figure 6C:
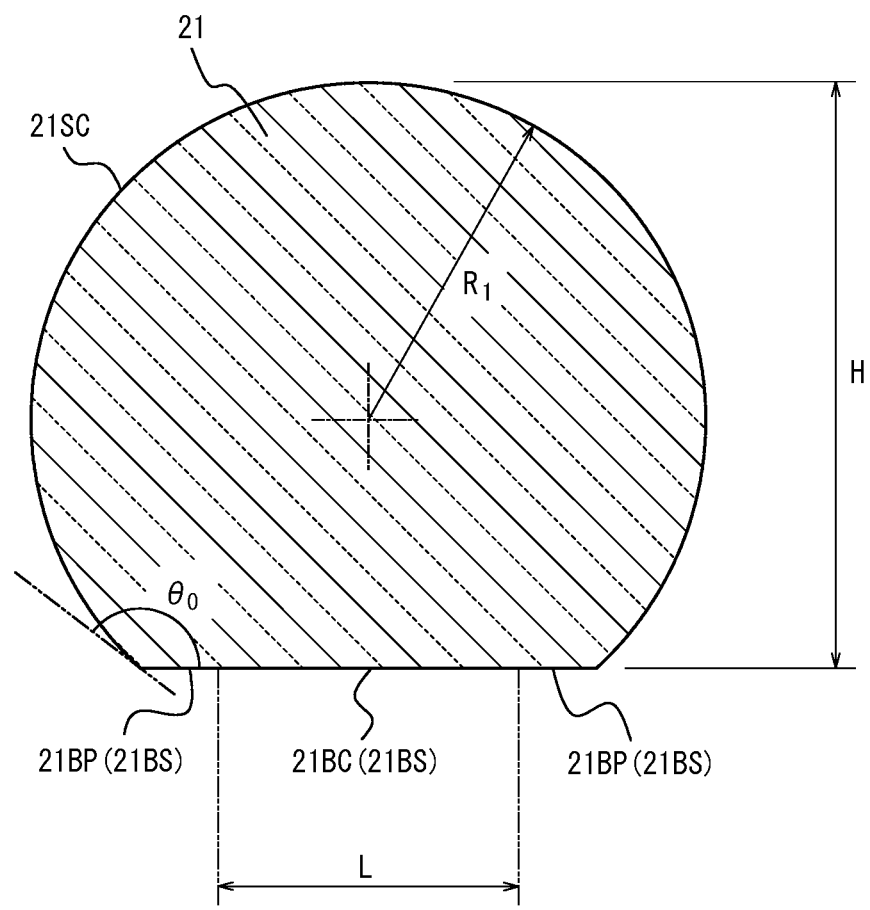
FIG. 6C is still another aspect of the first lens applicable to the light-emitting element lamp according to the present invention.

Refer to FIGS. 6A-6C. As described above, the first lens 21 has a spherical segment shape and has a spherical cap 21SC and a bottom surface 21BS. The spherical cap 21SC includes a radius of curvature $R_1$ (corresponding to the radius of the spherical segment). The bottom surface 21BS includes an attaching surface 21BC to the substrate back surface 11B of the light-emitting element 10 and a protruding surface 21BP from the substrate back surface 11B. Then, the first lens 21 is attached to the substrate back surface 11B of the substrate 11 at the attaching surface 21BC and protrudes from the substrate 11 at the protruding surface 21BP. A bonding layer (not illustrated) may be provided between the first lens 21 and the substrate 11. Further, it is particularly preferable that, when the light-emitting element 10 and the first lens 21 are attached, the central axis of the first lens 21 and the central axis of the light-emitting element 10 are aligned to each other.

<<Material>>

A hard lens may be used as the first lens 21, and synthetic quartz and other inorganic glasses may be used. It is preferable that the material is not easily deteriorated even when irradiated with ultraviolet rays and deep ultraviolet rays, and synthetic quartz is preferable. Further, sapphire or the like may be used for the first lens 21. A known antireflection film (AR coat) may be provided on the surface 21SC of the first lens 21.

<<Shape>>

FIGS. 6A through 6C illustrate specific aspects of the first lens 21 applicable to the present invention. In the first lens 21 illustrated in FIG. 6A, FIG. 6A is a vertical cross-section passing through the apex of the first lens, and the radius of curvature $R_1$ and the maximum height H from the bottom surface 21BS of the spherical crown 21SC (hereafter referred to as the height H) are equal in size ($R_1$=H). In the case of FIG. 6A, the shape of the first lens 21 is a hemisphere (the cross section is a semicircle), and the contact angle $\theta_0$ between the bottom surface 21BS of the first lens 21 and the tangent of the spherical cap 21SC at the outer edge of the bottom surface 21BS is 90° ($\theta_0$=90°). Further, in the first lens 21 illustrated in FIG. 6B, the height H of the spherical cap 21SC is smaller than the radius of curvature $R_1$ ($R_1$>H). Thus, the contact angle $\theta_0$ between the bottom surface 21BS of the first lens 21 and the tangent of the spherical cap 21SC at the outer edge of the bottom surface 21BS is less than 90° (0°<$\theta_0$<90°). Further, in the first lens 21 illustrated in FIG. 6C, the radius of curvature $R_1$ is smaller than the height H of the spherical cap 21SC ($R_1$<H). Thus, the contact angle $\theta_0$ between the bottom surface 21BS of the first lens 21 and the tangent of the spherical cap 21SC at the outer edge of the bottom surface 21BS exceeds 90° (90°<$\theta_0$<180°).

Although the shape of the first lens 21 is not particularly limited, to improve the light extraction efficiency from the substrate back surface 11B of the substrate 11 and effectively extract the reflected light entering from the second lens 22 into the first lens 21 to the outside, it is preferable that the height H of the spherical cap 21SC is smaller than or equal to the radius of curvature $R_1$ (0°<$\theta_0$≤90°). When the radius of curvature $R_1$ is smaller than the height H of the spherical cap 21SC (90°<$\theta_0$<180°), the reflected light entering from the second lens 22 into the first lens 21 is not extracted to the outside, and the percentage of returning to the light-emitting element increases and the effect of the present invention may not be obtained. Furthermore, for this purpose, it is more preferable that the height H of the spherical cap 21SC equals to the size of the radius of curvature $R_1$ ($\theta_0$=90°). In this case, the shape of the first lens 21 is hemisphere.

<<Relationship between D and L>>

Refer to FIG. 2 again. The first lens 21 protrudes from the light-emitting element 10. Therefore, the outer diameter D of the first lens 21 equals to the diameter (for a quadrangle, it is a diagonal line, and for a square, it is √2×L) of the circumscribed circle having a shape of the substrate back surface (attaching surface) of the light-emitting element 10 when looking down it, or is larger than the diameter of the circumscribed circle. As long as this condition is satisfied, the size of the outer diameter D is not particularly limited, and is geometrically determined according to the radius of curvature $R_1$ and the height H.

<<Relationship between $R_1$ and L>>

In order to increase the light extraction efficiency more, it is preferable that the relationship between the length L of the long side of the substrate back surface (attaching surface) and the size of the radius of curvature $R_1$ is (√2/2)×L≤$R_1$ and 0.8×L≤$R_1$. Although the upper limit of $R_1$ is not limited, it is preferable that it is $R_1$≤√2×L. In particular, 1.0× L≤$R_1$≤√2×L is preferable.

<Second Lens>

Refer to FIG. 2. As described above, the second lens 22 is attached to two surfaces such as the side of the light-emitting element 10 and the protruding surface 21BP of the first lens 21 (hereinafter referred also as a corner). Then, the second lens 22 has the concave curve 22CS from the peripheral side of the bottom surface 21BS of the first lens 21 to the semiconductor layer 12 side on the side of the light-emitting element 10. The second lens 22 can be formed of, for example, a translucent resin cured product, as will be described later.

As illustrated in FIG. 2, in addition to the concave curve 22CS, the second lens 22 may have a flat surface on the opposite side of the attaching surface to the first lens 21, or may not have such a flat surface. Further, there may be areas with no resin cured product on the periphery of the bottom surface 21BS, or there may be areas with no resin cured product near the side of the semiconductor layer 12. The second lens 22 is preferably provided on all four sides of the light emitting element 10. When the substrate back surface 11B of the substrate 11 is square, it is particularly preferable that these four second lenses 22 are 90° rotationally symmetrical.

<<Material>>

The material of the second lens 22 is not limited as long as it can transmit the light of the light-emitting element 10 and can provide the concave curve 22CS. When the light-emitting element 10 is an ultraviolet light-emitting element, it is preferable that the material does not easily deteriorate even when irradiated with ultraviolet rays and deep ultraviolet rays. In FIG. 2 and the like, hatching is applied to the second lens 22 to indicate translucent resin, but the material of the second lens 22 does not have to be resin as long as it is a translucent material, and it can be synthetic quartz. However, in terms of efficient fabrication of the light-emitting element lamp 100 and strengthening adhesion between the substrate 11 and the first lens 21, it is preferable that the second lens 22 includes a resin cured product. Further, a known antireflection film (AR coat) may be provided on the surface of the second lens 22.

It is preferable that the resin cured product contains one or more selected from the group consisting of acrylic resin, epoxy resin, silicone resin, unsaturated polyester resin, fluororesin, oxetane resin, polyimide resin, polysilazane resin, polyvinyl ether resin, polycarbonate resin, polystyrene resin, and polyester resin, and it is more preferable that it contains one or more selected from the group consisting of acrylic resin and fluororesin.

—Fluororesin—

As the fluororesin mentioned above, an amorphous fluororesin is preferable from the viewpoint of ultraviolet light resistance (deep ultraviolet light resistance). Examples of fluororesin include polytetrafluoroethylene (PTFE), perfluoro-diene polymer, and perfluoro (4-vinyl oxy-1-butene) (BVE) polymer. These may be used alone or in combination of two or more. Examples of trade names of fluororesin include Teflon® AF series (manufactured by DuPont), Fluon series (manufactured by Asahi Glass Co., Ltd.), and Cytop (manufactured by Asahi Glass Co., Ltd.). However, the present invention is not limited by these examples.

—Acrylic Resin—

From the viewpoint of ultraviolet light resistance, it is preferable that the acrylic resin includes one or more selected from the group consisting of urethane acrylate resin, polyester acrylate resin, epoxy acrylate resin, and polyol acrylate resin. These acrylate resins may be modified with an alkylene oxide group, a carboxyl group, a urethane group, an amino group, or the like. Further, some hydrogens of these functional groups may be replaced by alkali metals or alkaline earth metals. More specific acrylic resins include, for example, acrylic resins polymerized using the Photobond series (manufactured by Sunrise MSI Co., Ltd.), Optoclave series (manufactured by MS Adell Co., Ltd.), or TB series (manufactured by ThreeBond Co., Ltd.). However, the present invention is not limited by these examples. The acrylate resins described above have at least one monomer selected from acrylate and methacrylate as a repeating unit, and include resins obtained by copolymerizing two or more kinds of monomers.

The preferable refractive index (measurement conditions: 15 to 35° C., wavelength: 280 nm) of the resin cured product forming the second lens 22 may be smaller than that of the substrate 11, and it is preferably from 1.2 to 1.8, and more preferably from 1.3 to 1.7. When the refractive index of the resin cured product is the above-described range, the light extraction efficiency can be improved more reliably.

<<Size>>

Although the size of the radius of curvature of the concave curve 22S is not particularly limited, to increase the light extraction efficiency from sides of the light emitting element 10, it is preferable that the second lens 22 has a minimum radius of curvature $R_2$ of 1.2 mm or less on a concave curve in a cross-section that passes through the apex of the first lens, is parallel to the long side of the substrate back surface (attaching surface) of the light-emitting element 10 and is perpendicular to the substrate back surface (attaching surface). This is because, when the minimum radius of curvature $R_2$ is larger than 1.2 mm, the second lens 22 is almost flat with respect to the side of the substrate, which may reduce the effect of increasing the light extraction efficiency. The lower limit of the minimum radius of curvature $R_2$ is not particularly limited, and the minimum radius of curvature $R_2$ may be greater than or equal to half the thickness of the light emitting element 10, and may be greater than or equal to half the thickness of the substrate 11.

The light-emitting element lamp 100 according to an embodiment of the present invention has been described above. Since the lamp 100 includes the second lens 22 provided with the concave curve 22CS, the light extraction efficiency of the side emission light can be increased, and the light extraction efficiency of the entire lamp 100 can also be increased. Further, the lamp 100 can be used as a monochromatic light source of visible light, ultraviolet light or deep ultraviolet light.

The lamp 100 can be surface mounted on a circuit board (not illustrated) using solder paste, silver paste, or the like (Manufacturing Method)

Next, an embodiment of the method of manufacturing the light-emitting element lamp 100 described above will be described. The method of manufacturing the lamp 100 includes a first step of placing the substrate back surface 11B of the substrate 11 of the light-emitting element 10 on the bottom surface 21BS of the first lens 21 and a second step of forming the second lens 22 to be attached to the side of the light-emitting element 10 and the protruding surface 21BP of the first lens 21. The details of each step and preferred embodiment will be described below with reference to FIGS. 7A and 7B.

First Step

Figure 7A:
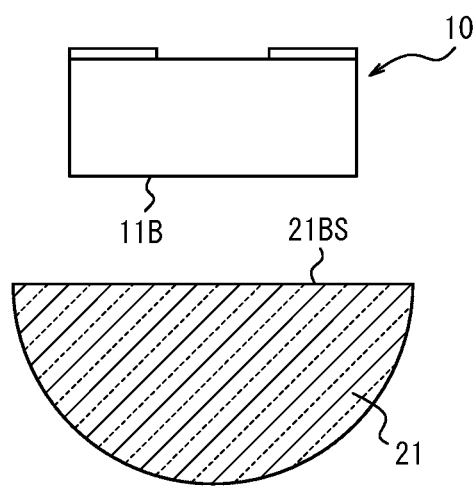
FIG. 7A is a schematic cross-sectional view illustrating an embodiment of a manufacturing method of the light-emitting element lamp according to the present invention.
Figure 7A:
Figure 7A:
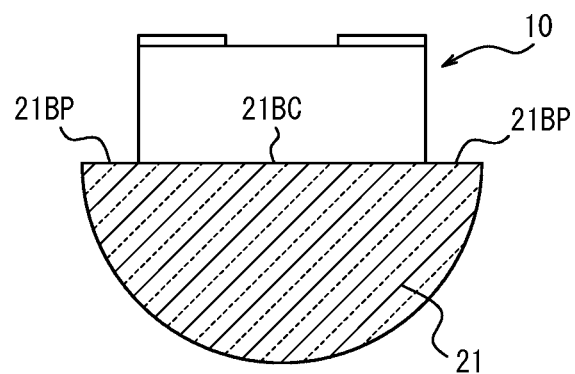

Refer to FIG. 7A. In the first step, the substrate back surface 11B of the substrate 11 of the light-emitting element 10 is placed on the bottom surface 21BS of the first lens 21. The first step can be performed by steps S11 and S12, for example, described below. In step S11, the bottom surface 21BS of the first lens 21 is faced up so that it faces the substrate back surface 11B of the substrate 11 of the light-emitting element 10. At this time, the first lens 21 may be temporarily fixed with an appropriate jig (not illustrated) to prevent it from tilting. Then, in step S12, the substrate back surface 11B of the substrate 11 of the light-emitting element 10 is arranged in the center of the bottom surface 21BS of the first lens 21. It is also preferable to temporarily fix the light-emitting element 10 by holding it down from above, etc.

Second Step

Then, in the second step, the second lens 22 is formed so that it is attached to the side of the light emitting element 10 and the protruding surface 21BP of the first lens 21. The second lens 22 provided with the concave curve 22CS may be fitted with the light-emitting element 10. Further, in the second step, it is also preferable to sequentially perform the application step (from step S21 to step S22) and the curing treatment step (step S23) described in detail below with reference to FIG. 7B.

Application Step

In the application step (step S21 to step S22), a precursor 220 of resin cured product is applied to a corner created by at least the substrate side on the side of the light-emitting element 10 and the protruding surface 21BS of the first lens 21 with a nozzle 210, or the like (step S21). At this time, the light-emitting element 10 may be temporarily fixed (not illustrated) to the first lens 21 by holding the light-emitting element 10 from above. As with step S21, the precursor 220 of the resin cured product is then applied to corners not applied with the precursor 220 of the resin cured product (step S22). Further, the precursor 220 may be applied so that the corners on the entire circumference of the sides of the light-emitting element 10 are covered with the precursor 220 of the resin cured product. In addition, since the protruding width of the protruding surface 21BS of the first lens 21 at the corner becomes narrower from the center of the side on the substrate back surface to the apex, it is preferable that the application amount is adjusted so that the precursor does not overflow from the first lens 21.

The application method in this application step is not particularly limited as long as the application amount can be adjusted according to the material of the second lens 22, and a known method can be adopted. Examples of such an application method include an inkjet method, a dispenser method, and the like. From a viewpoint of capable of adjusting the discharge amount, it is preferable to use the dispenser method in the application step.

When a precursor of resin cured product with a relatively large volume contraction (e.g., volume contraction: 75-85%) is applied, it is preferable to control the minimum discharge amount to 0.1 [μL] or less. The precursor of such a resin cured product preferably contains, for example, a fluororesin, and more preferably contains an amorphous fluororesin. In contrast, when a precursor of resin cured product with a relatively small volume contraction (volume contraction: 5-10%) is applied, it is preferable to control the minimum discharge amount to 0.01 [μL] or less. The precursor of such a resin cured product preferably contains, for example, one or both of an acrylic resin and a (meth) acrylic monomer.

The "volume contraction" herein means {volume of the precursor of the resin cured product before the curing process ($V_o$)–volume of the resin cured product after the curing process ($V_i$)}/{volume of the precursor of the resin cured product before the curing process ($V_o$)}.

As examples of a dispenser with a minimum discharge of resin cured product of 0.01 [μL] or less include NANO-MASTER® SMP-III (manufactured by Musashi Engineering), Stream Jet LV Valve (manufactured by SSI Japan Inc.), Tofutty-nano (manufactured by Ikamus Lab Co., Ltd.), etc.

—Resin Material—

The precursor of the resin cured product applicable to the above-described application step may contain a known monomer in addition to the resin exemplified in the resin cured product described above, or in place of the resin. Furthermore, the precursor of the resin cured product may contain at least one kind selected from the group consisting of known additives and solvents, if necessary.

The monomer is appropriately selected according to the resin cured product constituting the second lens 22. For example, (meth) acrylic monomer, fluorine-based monomer, epoxy monomer and the like may be used. The additive described above is appropriately selected according to the resin cured product constituting the second lens 22. Examples include chemical crosslinking agents, curing agents, photopolymerization initiators, thermal polymerization initiators, polymerization inhibitors, or catalysts. The solvent is not particularly limited, and can be appropriately selected depending on the resin cured product to be manufactured. Examples include alcohols, ketones, esters, amides, ethers, ether esters, aliphatic hydrocarbons, halogenated hydrocarbons (including fluorine-containing solvent) and the like. For example, when a fluororesin is selected as a resin cured product, it is preferable to use a fluorine-containing solvent such as perfluorotributylamine, perfluorohexane, and perfluorooctane.

<<Curing Treatment Step>>

In the curing treatment step, the precursor 220 is cured to form the second lens 22 (step S23). The second lens 22 made of resin cured product can be formed by applying light irradiation such as ultraviolet light to the surface applied with the precursor 220 of resin cured product in the application step described above, or by curing the precursor 220 of the resin cured product by heating. At this time, since the precursor 220 of the resin cured product contracts as it cures, the concave curve 22CS is formed from the semiconductor layer 12 side of the light-emitting element 10 to the peripheral side of the protruding surface 21BS of the first lens 21. In the application step, the precursor 220 of the resin cured product may infiltrate between the substrate back surface 11B of the light-emitting element 10 and the first lens 21. This infiltrated precursor 220 may be cured as the concave curve 22CS is formed.

The curing treatment conditions in the curing treatment step are not particularly limited, and may be appropriately selected depending on the resin cured product constituting the second lens 22 and its precursor material. The monomer may be polymerized to form a resin cured product, the resin may be used as it is as a resin cured product, or one or both of the resin and the monomer may be polymerized to obtain a cured resin product. Therefore, examples of the curing treatment step include a curing treatment by solvent dilution, a curing treatment by heat curing, a curing treatment by photocuring, or a curing treatment by a combination thereof. For example, to cure the amorphous fluororesin, it is preferable to heat at 80° C. or higher for 3 hours or longer, and more preferably for 5 hours or longer. This is because the light emission output may not be stable if curing is insufficient.

The above-described manufacturing method is an example, and various manufacturing methods can be used as long as the second lens 22 of the present invention can be obtained. For example, in the first step of the above-described manufacturing method, the bottom surface 21BS of the first lens 21 is faced up, and the resin material may be applied in advance to the region of the bottom surface 21BS of the first lens 21 so that a gap is not generated between the substrate 11 and the first lens. Further, in the first step of the above-described manufacturing method, the bottom surface 21BS of the first lens 21 is faced up, and the resin material is applied in advance to the bottom surface 21BS of the first lens 21 so that the resin material has a specific distribution on the surface. Further, in this state, the substrate back surface 11B of the substrate 11 is faced to the bottom surface 21BS so that they are in close contact with each other. Then, each corner formed by the side of the substrate and the protruding surface 21BP of the first lens 21 is filled with the resin material together with the resin material protruding from the attaching surface such as in step S22 of FIG. 7B. In this manner, the first step and the second step are performed in succession and the resin application step in the second step may be omitted.

As described above, the manufacturing method of the light-emitting element lamp according to the present invention includes: a first step of placing a bottom surface of a first lens of spherical segment shape having a spherical cap with a radius of curvature $R_1$ on a substrate back surface on the opposite side of the semiconductor layer of the substrate of a light-emitting element having a semiconductor layer provided on the substrate; and a second step of forming a second lens attached to two surfaces, that is, a protruding surface from the substrate back surface of the bottom surface of the first lens, excluding an attaching surface to the substrate back surface, and a side of the light-emitting element. The second step includes a step in which the second lens forms a concave curve from a peripheral side of the bottom surface of the first lens to the semiconductor layer side on the side of the light-emitting element.

EXAMPLES

The present invention will be described in more detail below using examples, but the invention is not limited in any way to the following examples.

In the following examples, the radius of curvature of the curve formed on the resin cured lens (second lens) was constant, so the minimum radius of curvature $R_2$ is also referred to simply as a radius of curvature $R_2$. Further, in order to distinguish whether the second lens is concave or convex curve, if the inclined surface of the second lens is a concave curve when viewed from the two wall surfaces such as the side of the light-emitting element 10 and the protruding surface 21BP of the first lens 21, the radius of curvature $R_2$ is indicated as a positive value, and if it is a convex curve, the radius of curvature $R_2$ is indicated as a negative value.

Example 1

Invention Example 11

FIG. 2 described above is referred for dimensional symbols. A light-emitting element of ultraviolet light with a light emission wavelength of 280 nm (light extraction efficiency of bare chip $\eta_{extra}$: 0.40) was prepared by growing an AlGaN-based III nitride semiconductor layer on a sapphire substrate (substrate thickness: 430 µm, mirrored on both sides), forming p-type and n-type electrodes, and then cutting into pieces so that the shape of the substrate back surface was 1 mm square (the length L of one side: 1 mm). In this experimental example 1 and the experimental example 2 described below, the thickness of the sapphire substrate (430 µm) is regarded as a chip thickness of the light-emitting element.

Apart from the above-described light-emitting element, a hemispherical synthetic quartz lens (first lens) with a radius of 0.71 mm (radius of curvature $R_1$: 0.71 mm), a height H of 0.71 mm, and an outer diameter D of 1.41 mm was prepared.

With the bottom surface of the synthetic quartz lens facing up, the substrate back surface (top surface of the chip) of the sapphire substrate of the light-emitting element facing the bottom surface of the synthetic quartz lens, and the center of the synthetic quartz lens aligned with the center of the light-emitting element, the light-emitting element was placed in the center of the bottom surface of the synthetic quartz lens.

Figure 7B:
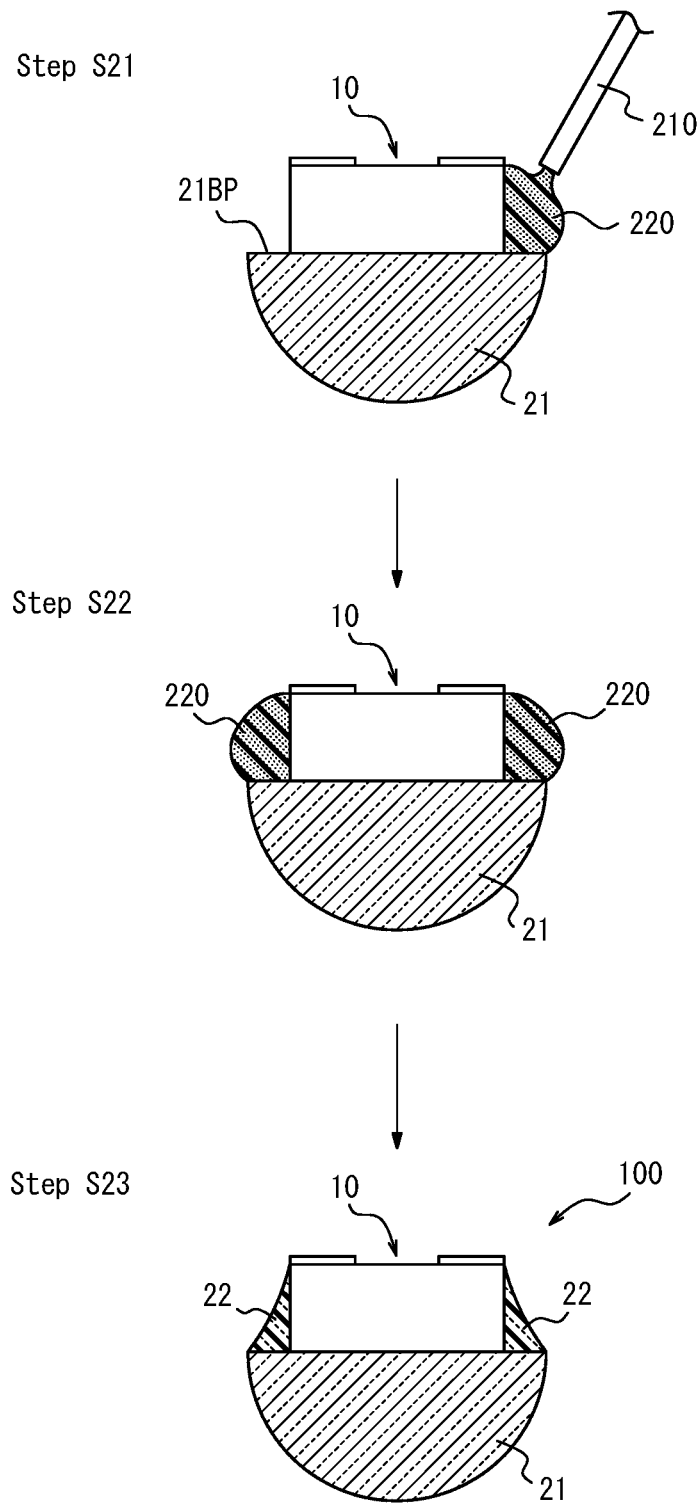
FIG. 7B is a schematic cross-sectional view illustrating an embodiment of the manufacturing method of the light-emitting element lamp according to the present invention, followed by FIG. 7A.

Then, with the bottom surface of the synthetic quartz lens remained facing upward, acrylic resin (PHOTOBOND® 475 manufactured by Sunrise MSI Co., Ltd.) was applied to the side of the light-emitting element and the protruding surface of the synthetic quartz lens using a dispenser (NANOMASTER® SMP-III manufactured by Musashi Engineering Co., Ltd.) in the same manner as described using FIG. 7B. A stainless steel nozzle (outer diameter 100 µm, inner diameter 60 µm) was used for the injection portion. After this application was repeated to four sides, the above-described acrylic resin was cured by sequentially applying photocuring and heating according to the following conditions to form a resin cured lens (second lens) having a concave curve.

Photocuring Conditions
    Use wavelength: 365 nm
       Output: 2.0 mW/cm$^2$
       Irradiation time: 30 min.
    Heating conditions
       Heating temperature: 260° C.
       Heating time: 10 min.

The curing shrinkage after curing the acrylic resin was 10%, and as a result of measuring the shape after curing with a shape analysis laser microscope (VHX-5000 manufactured by KEYENCE), the radius of curvature of the concave curve of the cured product was constant, and the minimum radius of curvature (radius of curvature) $R_2$ was 0.61 mm. In this manner, the light-emitting element lamp according to the Invention Example 11 was produced.

Invention Examples 12-17

Although the radius (radius of curvature $R_1$), the outer diameter D, and the height H of the synthetic quartz lens was 0.71 mm, 1.41 mm and 0.71 mm, respectively, in Invention Example 11, the synthetic quartz lenses with the values illustrated in Table 1 were prepared. Furthermore, although the radius of curvature $R_2$ of the concave curve of the resin cured product lens was 0.61 mm in Invention Example 11, the resin cured product lenses with the values illustrated in Table 1 were formed. In order to adjust the radius of curvature $R_2$ of the resin cured product lens, the light curing conditions and the heating conditions were also adjusted. The other conditions were the same as those in Invention Example 11, and Invention Examples 12-17 were prepared.

Invention Examples 21, 22, 31 and 32

Although the substrate thickness of the light-emitting element was 430 µm in Invention Example 11, the light-emitting element chip with the values illustrated in Table 1 was prepared. Furthermore, although the radius of curvature $R_2$ of the concave curve of the resin cured product lens was 0.61 mm in Invention Example 11, the resin cured product lens with the values illustrated in Table 1 was formed. In order to adjust the radius of curvature $R_2$ of the resin cured product lens, the light curing conditions and the heating conditions were also adjusted. The other conditions were the same as those in Invention Example 11, and Invention Examples 21, 22, 31 and 32 were produced.

Invention Example 41

Although the radius (radius of curvature $R_1$) and the height H of the synthetic quartz lens were 0.71 mm and 0.71, respectively, in Invention Example 11, the synthetic quartz lens with $R_1$ of 1.20 mm and the height H of 0.23 illustrated in Table 1 was prepared. The other conditions were the same as those in Invention Example 11, and Invention Examples 41 was produced.

Comparative Example 11

Although the resin cured product lens (second lens) was formed in Invention Example 11, the resin cured product lens (second lens) was not formed in Comparative Example 11. The other conditions were the same as those in Invention Example 11, and Comparative Example 11 was produced.

Comparative Example 12

Although the acrylic resin was photocured for 30 minutes in Invention Example 11, the acrylic resin was photocured for 10 minutes in Comparative Example 12. Furthermore, heating after photocuring in Invention Example 11 was omitted to cause insufficient shrinkage. Although a concave curved resin cured product lens with a radius of curvature $R_2$ of 0.61 mm was formed in Invention Example 11, due to the insufficient shrinkage as described above, a convex curved resin cured product lens with a radius of curvature $R_2$ of −0.53 mm (a convex curved second lens) was formed in Comparative Example 12. The other conditions were the same as those in Invention Example 11, and Comparative Example 12 was produced.

Comparative Example 41

Although the resin cured product lens (second lens) was formed in Invention Example 41, the resin cured product lens (second lens) was not formed in Comparative Example 41. The other conditions were the same as those in Invention Example 41, and Comparative Example 41 was produced.

Comparative Example 42

Although the acrylic resin was photocured for 30 minutes in Invention Example 41, the acrylic resin was photocured for 10 minutes in Comparative Example 42. Furthermore, heating after photocuring in Invention Example 41 was omitted to cause insufficient shrinkage. Although a concave curved resin cured product lens with a radius of curvature $R_2$ of 0.61 mm was formed in Invention Example 41, due to the insufficient shrinkage as described above, a convex curved resin cured product lens with a radius of curvature $R_2$ of −0.53 mm (a convex curved second lens) was formed in Comparative Example 42. The other conditions were the same as those in Invention Example 41, and Comparative Example 42 was produced.

Evaluation

The light extraction efficiency $\eta_{extra}$ of each of the deep ultraviolet lenses according to Invention Examples 11-17, 21, 22, 31 and 32 and Comparative Examples 11 and 12 was determined as follows. The light extraction efficiency $\eta_{extra}$ is (the amount of light extracted to the outside)/(the amount of light generated inside the light-emitting element). In this evaluation, (the amount of light generated inside the light-emitting element) is regarded as being equal to (input power−calorific value). The amount of light (W) extracted to the outside was measured with the integrating sphere. The input power (W) was calculated from an ammeter and a voltmeter. For the calorific value (W), the junction temperature (° C.) during operation was measured by the thermal resistance measurement (ΔVf method), and the calorific value (W) was calculated from the thermal resistance Rth (° C./W) obtained separately. At the same time, the ratio of the light emission output of the deep ultraviolet lens to the light emission output of the bare chip was obtained from the value of the total output measured with the integrating sphere. Table 1 shows the results. For convenience, Table 1 also shows the results of Invention Example 51, which was produced in Experimental Example 2 described below.

TABLE 1

| | Chip thickness [mm] | $R_1$ [mm] | $R_2$ [mm] | L [mm] | D [mm] | H [mm] | Chip output: output (times) | Light extraction efficiency ηextra |
|---|---|---|---|---|---|---|---|---|
| Invention Example 11 | 0.43 | 0.71 | 0.61 | 1.00 | 1.41 | 0.71 | 1.65 | 0.65 |
| Invention Example 12 | 0.43 | 0.80 | 0.61 | 1.00 | 1.60 | 0.80 | 1.83 | 0.72 |
| Invention Example 13 | 0.43 | 1.00 | 0.61 | 1.00 | 2.00 | 1.00 | 2.15 | 0.84 |
| Invention Example 14 | 0.43 | 1.20 | 0.61 | 1.00 | 2.40 | 1.20 | 2.20 | 0.86 |
| Invention Example 51* | 0.43 | 1.20 | 0.61 | 1.00 | 2.40 | 1.20 | 1.94 | 0.76 |
| Invention Example 15 | 0.43 | 1.40 | 0.61 | 1.00 | 2.80 | 1.40 | 2.19 | 0.86 |
| Invention Example 16 | 0.43 | 0.71 | 0.42 | 1.00 | 1.41 | 0.71 | 1.69 | 0.66 |
| Invention Example 17 | 0.43 | 0.71 | 0.90 | 1.00 | 1.41 | 0.71 | 1.62 | 0.64 |
| Invention Example 21 | 0.55 | 0.71 | 0.61 | 1.00 | 1.41 | 0.71 | 1.63 | 0.65 |
| Invention Example 22 | 0.65 | 0.71 | 0.61 | 1.00 | 1.41 | 0.71 | 1.63 | 0.66 |
| Invention Example 31 | 0.55 | 0.71 | 0.42 | 1.00 | 1.41 | 0.71 | 1.67 | 0.67 |
| Invention Example 32 | 0.65 | 0.71 | 0.42 | 1.00 | 1.41 | 0.71 | 1.67 | 0.67 |
| Invention Example 41 | 0.43 | 1.20 | 0.61 | 1.00 | 1.41 | 0.23 | 1.56 | 0.61 |
| Comparative Example 11 | 0.43 | 0.71 | — | 1.00 | 1.41 | 0.71 | 1.61 | 0.63 |
| Comparative Example 12 | 0.43 | 0.71 | −0.53 | 1.00 | 1.41 | 0.71 | 1.53 | 0.60 |

TABLE 1-continued

|  | Chip thickness [mm] | $R_1$ [mm] | $R_2$ [mm] | L [mm] | D [mm] | H [mm] | Chip output: output (times) | Light extraction efficiency $\eta$extra |
|---|---|---|---|---|---|---|---|---|
| Comparative Example 41 | 0.43 | 1.20 | — | 1.00 | 1.41 | 0.23 | 1.30 | 0.51 |
| Comparative Example 42 | 0.43 | 1.20 | −0.53 | 1.00 | 1.41 | 0.23 | 1.52 | 0.59 |

*See Experimental Example 2 for Invention Example 51

Observation of Evaluation Results

Comparing Comparative Example 11 with Invention Examples 11-17, 21, 22, 31, and 32 in Table 1, it was confirmed that the light extraction efficiency could be increased by providing resin cured product lenses with concave curve on the sides of the light-emitting element and on the protruding surface of the synthetic quartz lens. Further, in Comparative Example 12 in which the resin cured product lens with a convex curve was formed, the light extraction efficiency was lower than that in Comparative Example 11. It is thought that, this is because, as described above with reference to FIG. 4, with the convex curve, the side emission light cannot sufficiently be extracted from the inside of the lens.

Further, comparing Invention Examples 11 and 16 (chip thickness 430 μm), Invention Examples 21 and 31 (chip thickness 550 μm), and Invention Examples 22 and 32 (chip thickness 650 μm), respectively, it is thought that the radius of curvature $R_2$ affects the light extraction efficiency more than the chip thickness.

Next, we will focus on Invention Examples 11-15 in which the height H and the radius of curvature $R_1$ of the synthetic quartz lens are equal in size, the contact angle $\theta_o$ between the bottom surface of the synthetic quartz lens and its contact surface is 90°, and the only difference is the relationship between the radius (radius of curvature $R_1$) of the synthetic quartz lens and the length L of one side of the substrate back surface (attaching surface) of the light-emitting element. In this relationship, the outer diameter D and the height H are linked to the radius of curvature $R_1$. The radius of curvature $R_1$ in Invention Examples 11 to 15 is in the range of $(1/\sqrt{2})$ times or more and $\sqrt{2}$ times or less of the length L, and it was confirmed that the effect of the present invention could be reliably obtained by applying a synthetic quartz lens having this range of relationship between the radius of curvature $R_1$ and the length L to the present invention. It was confirmed that it was preferable to increase the radius of curvature $R_1$ and that the light extraction efficiency could be particularly increased when $R_1$ was 1.0 mm (1.0×L) or more.

The light extraction efficiency of Invention Example 41 is smaller than that of Comparative Example 11. This is because the radii of curvature $R_1$ (in other words, the contact angle) of the synthetic quartz lenses of these Examples are different. The light extraction efficiency of Invention Example 41 is greater than that of Comparative Examples 41 and 42 with the same radius of curvature $R_1$. Unlike Comparative Examples 41 and 42, Invention Example 41 is provided with a resin cured product lens having a concave curve, which allows Invention Example 41 to efficiently extract the side emission light.

Furthermore, the relationship between the height H and the radius of curvature $R_1$ of the synthetic quartz lens is examined. The light extraction efficiency of each of Invention Examples 11-17, 21-22 and 31-32 having the same height H and the radius of curvature $R_1$ is particularly good compared with that of Invention Example 41 (height H<radius of curvature $R_1$), not to mention with Comparative Examples 11, 12, 41 and 42. From this, it is confirmed that the contact angle θ0 between the bottom surface of the synthetic quartz lens and its ground plane is particularly preferably 90°. However, when comparing Invention Example 41 with Comparative Examples 41 and 42, which differ only with respect to the resin cured product lens, the light extraction efficiency of Invention Example 41 is better than the others, so it can be confirmed that the effect of the present invention can be reliably obtained when a synthetic quartz lens with a height H that is smaller than or equal to the radius of curvature $R_1$ (height H≤radius of curvature $R_1$) is applied to the present invention.

Experimental Example 2

Invention Example 51

Although acrylic resin was used to form the resin cured product in the above-described Experimental Example 1, an amorphous fluororesin (CYTOP® CTL-816AP manufactured by Asahi Glass Co., Ltd.) was used to produce a light-emitting element lamp so that it has the same lens parameters of Invention Example 15.

First, 19 vol % of the above-described amorphous fluororesin and 81 vol % of perfluorotributylamine as a fluorine-containing solvent were mixed to prepare a precursor of resin cured product. Next, the precursor of resin cured product was applied to the sides of the light-emitting element and the protruding surface of the synthetic quartz lens, and then placed in an oven heated to 50° C. for defoaming and held for 3 hours. After that the precursor was further heated to 80° C. for curing and held for 20 hours to cure the amorphous fluororesin. The other conditions were the same of those of Invention Example 14, and the light-emitting element lamp according to Invention Example 51 was produced. The light extraction efficiency $\eta_{extra}$ of Invention Example 14 was 0.86, and that of Invention Example 51 was 0.76. Since the light extraction efficiency $\eta_{extra}$ of the bare chip was 0.40, it was confirmed that the light extraction efficiency could be largely increased also with Invention Example 51.

INDUSTRIAL APPLICABILITY

According to the present invention, a light-emitting element lamp capable of increasing the light extraction efficiency and its manufacturing method can be provided.

REFERENCE SIGNS LIST

100 Light-emitting element lamp
10 Light-emitting element
11 Substrate
11A Substrate surface
11B Substrate back surface
12 Semiconductor layer
13 Electrode 21 First lens
21SC Spherical cap
21BS Bottom surface
21BP Protruding surface
21BC Attaching surface
22 Second lens
22CS Concave curve
$R_1$ Radius of curvature of first lens
$R_2$ Radius of curvature of second lens
L Width of substrate back surface and attaching surface
D Width of first lens
H Height of first lens
210 Nozzle
220 Precursor of resin cured product

The invention claimed is:

1. A light-emitting element lamp, comprising:
a light-emitting element having a semiconductor layer provided on a substrate;
a first lens of spherical segment shape provided by protruding from a substrate back surface on an opposite side of the semiconductor layer of the substrate and having a spherical cap including a bottom surface consisting of an attaching surface to the substrate back surface and a protruding surface from the substrate back surface and a radius of curvature $R_1$; and
a second lens attached to a side of the light-emitting element and the protruding surface of the first lens, wherein
the second lens has a concave curve from a peripheral side of the bottom surface of the first lens to a side of the semiconductor layer on the side of the light-emitting element,
the concaved curve of the second lens is configured to extract light from the light-emitting element out of the second lens,
a minimum radius of curvature $R_2$ of the concave curve of the second lens is greater than or equal to half a thickness of the light emitting element and smaller than or equal to 1.2 mm in a cross-section that passes through an apex of the first lens, is parallel to a long side of the attaching surface, and is perpendicular to the attaching surface, and
a thickness of the substrate is 200 μm or more and 1000 μm or less.

2. The light-emitting element lamp according to claim 1, wherein a height H of the spherical cap is smaller than or equal to the radius of curvature $R_1$.

3. The light-emitting element lamp according to claim 1, wherein a height H of the spherical cap is equal to the radius of curvature $R_1$.

4. The light-emitting element lamp according to claim 1, wherein the radius of curvature $R_1$ of the first lens is greater than or equal to $(1/\sqrt{2})$ times a length L of the long side of the attaching surface.

5. The light-emitting element lamp according to claim 1, wherein the radius of curvature $R_1$ of the first lens is smaller than or equal to $\sqrt{2}$ times a length L of the long side of the attaching surface.

6. The light-emitting element lamp according to claim 1, wherein the first lens includes quartz or sapphire.

7. The light-emitting element lamp according to claim 1, wherein the second lens includes a resin cured product.

8. The light-emitting element lamp according to claim 1, wherein a light emitting wavelength of the light-emitting element is from 200 to 400 nm.

9. A method of manufacturing the light-emitting element lamp according to claim 1, comprising:
a first step of placing the substrate back surface of the substrate of the light-emitting element on the bottom surface of the first lens; and
a second step of forming the second lens to be attached to the side of the light-emitting element and the protruding surface of the first lens.

10. The method of manufacturing the light-emitting element lamp according to claim 9, wherein, the second step includes:
(i) an application step of applying a precursor of a resin cured product to the side of the light-emitting element and the protruding surface of the first lens; and
(ii) a curing step of curing the precursor to form the second lens.

11. The method of manufacturing the light-emitting element lamp according to claim 9, wherein a light emitting wavelength of the light-emitting element is from 200 to 400 nm.

12. The light-emitting element lamp according to claim 1, wherein an antireflection film is provided on the concaved curve of the second lens.

13. The light-emitting element lamp according to claim 1, wherein
a refractive index of the second lens is smaller than a refractive index of the substrate, and
the refractive index of the second lens is 1.2 or more and 1.8 or less.

14. The light-emitting element lamp according to claim 1, wherein the minimum radius of curvature $R_2$ is 0.42 mm or more and 0.90 mm or less.

15. A method of manufacturing a light-emitting element lamp, comprising:
a first step of placing a bottom surface of a first lens of spherical segment shape having a spherical cap with a radius of curvature $R_1$ on a substrate back surface on an opposite side of a semiconductor layer of the substrate in a light-emitting element having the semiconductor layer provided on the substrate; and
a second step of forming a second lens to be attached to two surfaces, a protruding surface from the substrate back surface of a bottom surface of the first lens excluding an attaching surface to the substrate back surface and a side of the light-emitting element, wherein,
the second step includes a step in which the second lens forms a concave curve from a peripheral side of the bottom surface of the first lens to the side of the semiconductor layer on the side of the light-emitting element, wherein
the concaved curve of the second lens is configured to extract light from the light-emitting element out of the second lens,
a minimum radius of curvature $R_2$ of the concave curve of the second lens is greater than or equal to half a thickness of the substrate and smaller than or equal to 1.2 mm in a cross-section that passes through an apex of the first lens, is parallel to a long side of the attaching surface, and is perpendicular to the attaching surface, and
a thickness of the substrate is 200 μm or more and 1000 μm or less.

* * * * *